United States Patent

Chester et al.

Patent Number: 5,450,339
Date of Patent: Sep. 12, 1995

[54] NONCANONIC FULLY SYSTOLIC LMS ADAPTIVE ARCHITECTURE

[76] Inventors: David B. Chester, 961 Peacock Ave., NE.; William R. Young, 1532 Breezewood La., NW., both of Palm Bay, Fla. 32907

[21] Appl. No.: 774,620

[22] Filed: Oct. 10, 1991

[51] Int. Cl.$^6$ .................. G06F 15/31; G06F 7/38
[52] U.S. Cl. .................. 364/724.19; 364/724.01; 364/715.08
[58] Field of Search .......... 364/724.01, 724.13, 364/724.16, 724.19, 736, 715.08; 395/27; 370/112

[56] References Cited

U.S. PATENT DOCUMENTS

| | | | |
|---|---|---|---|
| 4,038,536 | 7/1977 | Feintuch | 364/724.19 |
| 4,754,419 | 6/1988 | Iwata | 364/724.19 |
| 4,791,390 | 12/1988 | Harris et al. | 364/724.19 |
| 4,862,455 | 8/1989 | Gillies | 370/112 |
| 4,947,362 | 8/1990 | Bui | 364/724.19 |
| 4,947,363 | 8/1990 | Williams | 364/724.19 |
| 5,005,120 | 4/1991 | Ruetz | 364/200 |
| 5,091,864 | 2/1992 | Baji et al. | 395/27 |

OTHER PUBLICATIONS

Meyer et al., "A Modular Pipelined Implementation of a Delayed LMS Tranversal Adaptive Filter", IEEE International Symposium on Circuits and Systems, vol. 3, pp. 1943–1946, 1990.

"A Fully Systolic Adaptive Filter Implementation", IEEE Signal Processing, vol. 3, pp. 2109–2112, 1991 by Chester et al.

"A Sampled Analgo Mos LSI Adaptive Filter"–pp. 406–412. (1979).

"Why Systolic Architectures?"–H. T. Kung–pp. 37–46. (1982).

*Primary Examiner*—Jerry Smith
*Assistant Examiner*—Chuong D. Ngo

[57] ABSTRACT

A noncanonic fully systolic least mean squares adaptive filter architecture encompasses both tap weight updates and filtering and allows cascadability without penalties in speed or accuracy. A systolic tap weight update section is followed by a systolic FIR filter section. An array control and alignment section and a forward loading shift register provides a modified coefficient update circuit which facilitates the interface between the two sections. This architecture allows for efficient microprocessor control of the filter algorithm.

22 Claims, 6 Drawing Sheets

SYSTOLIC FIR STATE MATRIX SHOWN AS DATA INDEX n
(A DATA SAMPLE IS x(n))

| SR0 | PRE MULT0 SR | SR1 | PRE MULT1 SR | SR2 | PRE MULT2 SR | SR3 | PRE MULT3 SR | SR4 | PRE MULT4 SR |
|---|---|---|---|---|---|---|---|---|---|
| - | -8 | - | - | - | - | - | - | - | - |
| - | - | -8 | -7 | - | - | - | - | - | - |
| - | - | - | -8 | -7 | -6 | - | - | - | - |
| - | - | - | - | -8 | -7 | -6 | -5 | - | - |
| - | - | - | - | - | -8 | -7 | -6 | -5 | -4 |
| -4 | -3 | - | - | - | - | -8 | -7 | -6 | -5 |
| -5 | -4 | -3 | -2 | - | - | - | -8 | -7 | -6 |
| -6 | -5 | -4 | -3 | -2 | -1 | - | - | -8 | -7 |
| -7 | -6 | -5 | -4 | -3 | -2 | -1 | 0 | - | -8 |
| -8 | -7 | -6 | -5 | -4 | -3 | -2 | -1 | 0 | 1 |
| 1 | 2 | -7 | -6 | -5 | -4 | -3 | -2 | -1 | 0 |
| 0 | 1 | 2 | 3 | -6 | -5 | -4 | -3 | -2 | -1 |
| -1 | 0 | 1 | 2 | 3 | 4 | -5 | -4 | -3 | -2 |
| -2 | -1 | 0 | 1 | 2 | 3 | 4 | 5 | -4 | -3 |
| -3 | -2 | -1 | 0 | 1 | 2 | 3 | 4 | 5 | 6 |
| 6 | 7 | -2 | -1 | 0 | 1 | 2 | 3 | 4 | 5 |
| 5 | 6 | 7 | 8 | -1 | 0 | 1 | 2 | 3 | 4 |
| 4 | 5 | 6 | 7 | 8 | 9 | 0 | 1 | 2 | 3 |
| 3 | 4 | 5 | 6 | 7 | 8 | 9 | 10 | 1 | 2 |
| 2 | 3 | 4 | 5 | 6 | 7 | 8 | 9 | 10 | 11 |

FIG. 2A

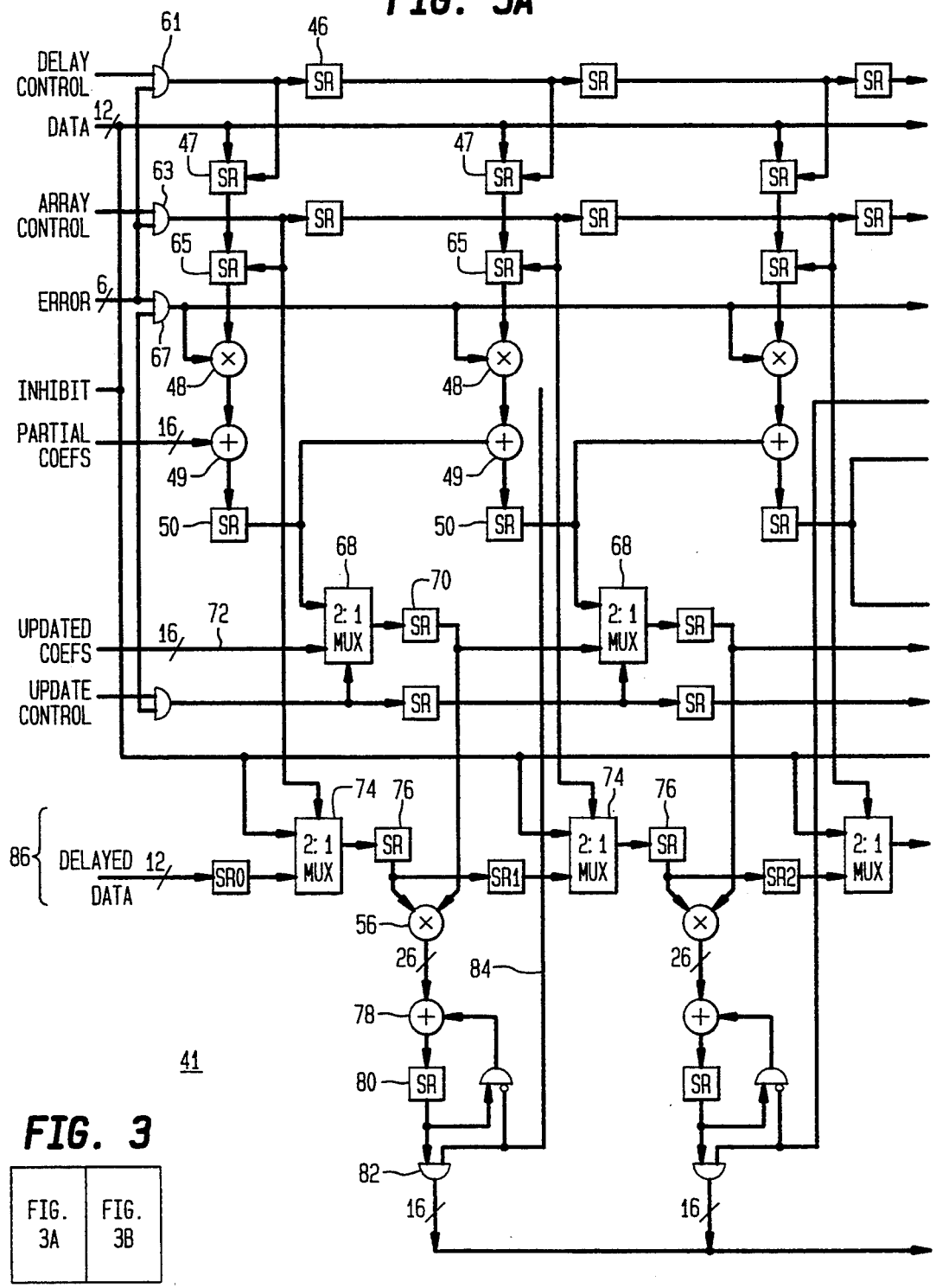

NONCANONIC FULLY SYSTOLIC LMS ADAPTIVE ARCHITECTURE

FIELD OF THE INVENTION

This invention relates to adaptive filter architectures and, more particularly, to a least mean square (LMS) adaptive filter implemented in a noncanonic fully systolic structure.

BACKGROUND OF THE INVENTION

Known LMS algorithms have generally been implemented in a transversal or parallel manner. An example of this standard transversal LMS implementation is shown in the five-tap transversal structure for a real LMS based equalizer in prior art FIG. 1. The standard transversal LMS adaptive equalizer structure 5 includes an actual real LMS implementation 10 included within the dashed lines and a data generating and feedback section 12. The implementation of prior art FIG. 1 is used to illustrate the required computational flow of the LMS algorithm as will be described in greater detail below.

A data source 14 in the data generating section 12 generates data as ideal binary baseband data. This ideal binary baseband data is sampled N times per symbol. Each symbol sample is represented as a voltage level as opposed to a single bit. The voltage level representation is passed to an inter-symbol interference (ISI) generator 16, for example, a fixed, 3-tap filter, to simulate inter-symbol interference. The output from the inter-symbol interference generator 16 is fed to an adder block 26 which receives as its other input a signal from an additive white gaussian noise (AWGN) generator 18. The addition of the additive white gaussian noise and ISI results in a corrupted output 43 from the adder block 26. This corrupted output 43 of the ideal binary baseband symbol data is then input to the equalizer section 10.

At the same time, an uncorrupted version of the ideal binary baseband symbol data is provided from the data source 14 to a delay block 20. The uncorrupted symbol data is delayed a predetermined number of sample times and is then fed as an output 21 to summation block 22. The delayed uncorrupted data is used as an errorless reference signal for the output 23 from the equalizer section 10. In the absence of a reference signal, a soft decision is used to generate the error signal. A soft decision is generated from the output of the equalizer and assumes that the equalizer has been trained to a reasonable channel estimate. In this case, the soft decision is used as the reference. The output of the equalizer is subtracted from the reference to form the error signal. The output of adder block 22 on line 41 is multiplied by gain factor $\mu$ from line 42 in multiplier 24 producing the resulting error signal e(k) which is fed back 28 to the equalizer section 10.

The predetermined amount of delay time, for example in FIG. 1 a two-sample time delay, is calculated so as to place the zero time offset of the equalizer section 10 to its center tap so that the equalizer 10 can correct for both pre- and post-symbol error sources.

The equalizer section 10 includes a delay line 25 composed of a number of delay registers 27, only one of which is designated. A first tap in the equalizer section 10 includes a coefficient update multiplier 30 which receives the corrupted output of the baseband data X(k+2) and the resulting error signal e(k) on output line 28. The coefficient update multiplier 30 provides an output signal 31 to an adder 32. The adder 32 adds its previous output 33 to the new input 31 and provides the sum to a coefficient register 34. The output of the coefficient register 34 is then provided to a coefficient multiplier 36 which further receives as its other input the data sample, x(k+2). The output 39 from the coefficient multiplier 36 is provided to a summation block 38. The summation block 38 further receives each of the outputs from the other coefficient multipliers from each tap in the equalizer section 10. The summation block 38 then provides its output signal 23 to the adder 22 as described above. While only one tap in the equalizer section 10 has been described, it is readily apparent that each of the remaining taps includes the same components but receives its data sample input after being delayed an appropriate amount via the delay line 25.

The known LMS based equalizer has the purpose of negating the effects of channel-induced inter-symbol interference. This is accomplished essentially by computing running, weighted cross-correlations between the computed error of each received symbol sample and each of the received symbol samples in the equalizer's coefficient or state registers 34. Periodically, these running cross-correlations, weighted by a feedback weighing factor $\mu$ (fed into multiplier 24), are loaded into the finite impulse response (FIR) filter section 40 of the equalizer 10 as the FIR's coefficients. The cross-correlation used for a given filter coefficient corresponds to the symbol data sample position in delay register 25 and the relative delay of the error corresponding to that sample. In doing this, a tap weight vector update is produced.

The above-described standard transversal LMS implementation has several disadvantages or limitations. For long filter applications, the summation tree formed with the summation block 38 presents latency problems in the filter. For example, the longer the filter, the more taps in the adaptive filter and the longer becomes the latency through the summation tree. This latency causes delays in the error calculations and eventually can lead to a situation wherein the error calculation occurs after the relevant data sample has exited the filter's state register.

For high-speed and long filter applications, the summation tree 38 further limits the cascadability of the architecture. The use of cascading requires either additional external summing hardware or an ability to cascade the output of one adaptive filter stage into the summation tree of the next cascaded block. This becomes very difficult as the word widths required are a log base two function of the number of cascaded stages.

Another known digital filter employs a systolic transposed FIR architecture to perform least means squares adaptive filtering. The adaptive filter contains dual delay lines to yield a sequence of simultaneous samples of both input and output symbol samples. This filter provides a modular implementation which can be cascaded together to form a higher order filter, however, the transposed FIR architecture requires that the FIR accumulation data be of sufficient width to allow accumulation without the introduction of error. Any rounding of the accumulated data between cascaded stages can introduce significant error.

There is therefore needed an architecture for generating a digital signal processing adaptive filter which will allow for implementation and cascading of individual chips in order to provide the desired and/or required filter length, i.e., the requisite number of filter taps. The design must allow for updating of the filter coefficients independent of the filter length and under full control of the user's command. The architecture must minimize package and pin placement requirements in order to provide a cost-effective and space-saving filter.

SUMMARY OF THE INVENTION

The present invention overcomes these problems by providing a fully-systolic noncanonical least mean squares adaptive filter architecture which lends itself well to systolic implementations of the filter algorithm and which encompasses both tap weight updates and filtering to allow for unlimited cascadability of filter sections or individual filter chips without penalties in speed or accuracy. The architecture includes a first delay line formed of a plurality of delay units directly in series, each delay unit having an input and an output, the input of a first delay unit of the first delay line serving as a first timing input of the filter; a plurality of loading registers, each loading register having a first input, clock input and an output, the first inputs of each loading register coupled in parallel serving as a data input of the filter and the clock inputs of each loading register being coupled to the first delay line with each clock input separated by one of the delay units; a plurality of multipliers, each multiplier having first and second inputs and an output, the first input of each multiplier being coupled to an output of a separate one of the loading registers and the second inputs of each multiplier coupled in parallel to an error input of the filter; a plurality of adders, each adder having first and second inputs and an output, the first inputs of each adders being coupled to an output of a separate one of the multipliers; a plurality of holding registers, each holding register having an input and an output, the inputs of each of the holding registers being coupled to an output of a separate one of the adders and the outputs of each holding register being fed to the second input of a separate next one of the adders in a chain-like manner; a plurality of first multiplexers, each first multiplexer having first and second inputs, a select input and an output, the first inputs of each first multiplexer being coupled to the output of a'separate one of the holding registers; a plurality of storage registers, each storage register having an input and an output, the inputs of each storage register being coupled to the output of a separate one of the multiplexers and the outputs of such storage register being coupled to the second input of a next one of said first multiplexers in a chain-like manner; a finite impulse response section providing a filter output including a plurality of second multipliers, each second multiplier having first and second inputs and an output, the first input of each of the second multipliers being coupled to the output of a separate one of the storage registers; a forward loading shift register circuit having a plurality of outputs with each one of the outputs being coupled to the second input of a separate one of the second multipliers, the forward loading shift register first loading current data samples into the forward loading shift register followed by old data samples in a sequential last-in-first-out manner.

It is an advantage of the present invention to provide a fully systolic architecture having a highly regular structure for facilitating VLSI implementations.

It is a further advantage of the present invention that no external or cascaded summation tree is required and therefore no additional latency relative to the data stream can be incurred through a summation tree when cascaded.

It is a still further advantage of the present invention that the filter output can be rounded without introducing any additional errors other than those caused by rounding the final output.

A preferred embodiment of the present invention implements the systolic noncanonical LMS algorithm via a program operable on any general purpose computer such as a Macintosh II or a Sun Sparcstation 1.

Another embodiment of the present invention makes use of only a single systolic noncanonical LMS filter section with a large memory. In this manner, the single filter section or computing element can operate at its computation rate and simply store its values in the memory. Thus, the single computing element can practically form a long filter in accordance with the amount of memory. This operation is particularly advantageous wherein there is a low data rate input to the filter section and a high computation rate within the filter section itself. By doing this, the filter section can iterate the data through its computations a multiple number of times so as to expand the filter length. For example, telephone communication links such as a T1 link operate at approximately 1.5 MHz whereas the computation rate of a filter section may be as high as 45 MHz. If sufficient memory is provided, then the single computing element can function as a filter having a length 30 times as great as itself.

Other objects, advantages and novel features of the present invention will become apparent from the following detailed description of the invention when considered in conjunction with the accompanying drawings.

BRIEF DESCRIPTION OF THE DRAWINGS

FIG. 2A is a table illustrating the state matrix for the FIR part of the filter of FIG. 2;

DETAILED DESCRIPTION OF THE DRAWINGS

Figure 1:
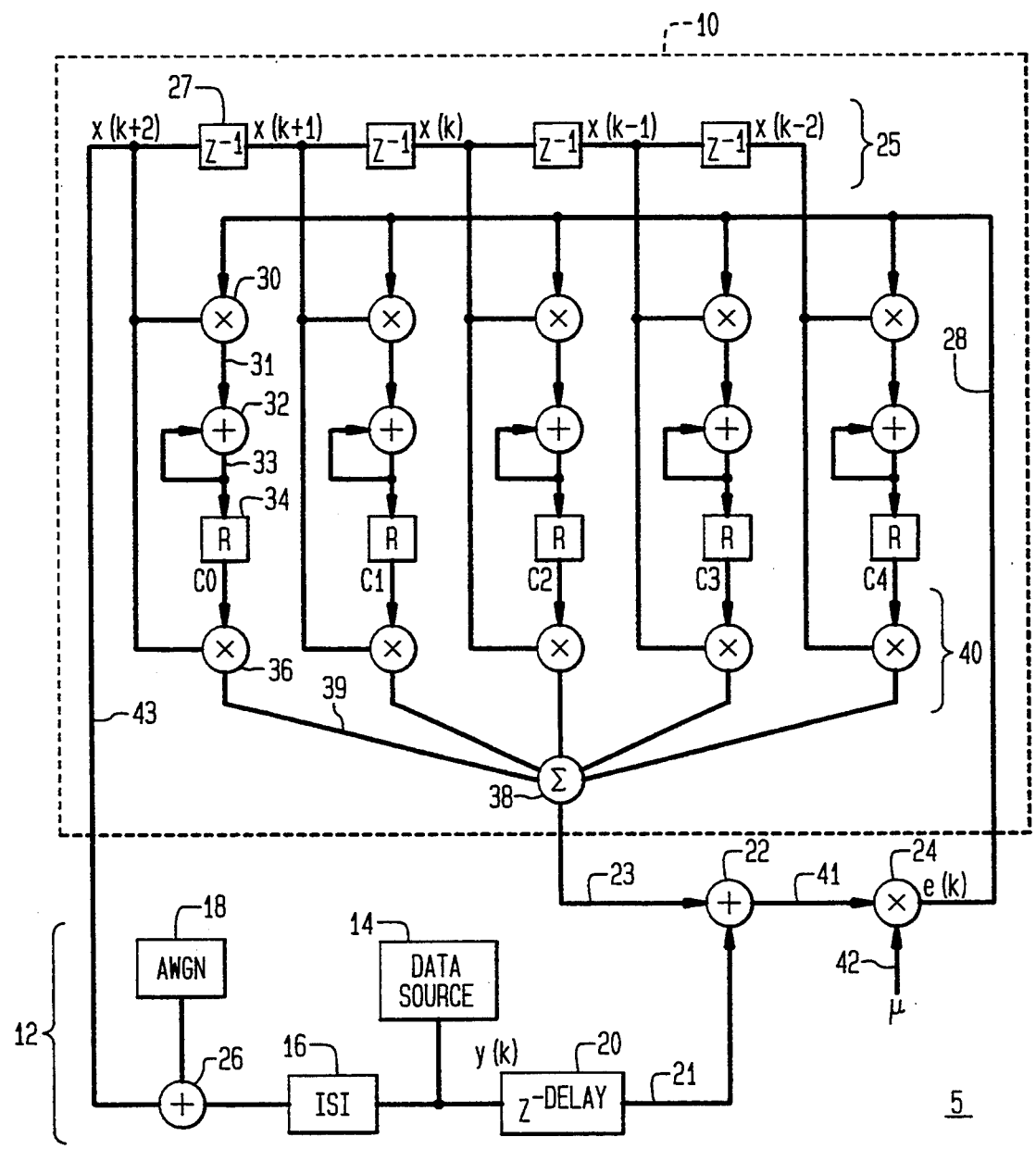
FIG. 1 is a prior art block diagram of a five-tap transversal implementation of a real LMS based equalizer.

In order to understand the present invention, a comparison between the standard transversal LMS implementation given in prior art FIG. 1 and that of the present invention will be performed. In doing this, the state equations for both architectures will be derived as a baseline for comparison. Referring back to prior art FIG. 1, assuming the LMS adaptive filter's state registers 25 and coefficient registers 34 are full, and the coefficient updates arbitrarily begin at k = 0, then the following state equations are derived to describe the system:

$$Y(0) = x(2)C0 + x(1)C1 + x(0)C2 + x(-1)C3 + x(-1)C3 + x(-2)C4$$

$$y(1) = x(3)C0 + x(2)C1 + x(1)C2 + x(0)C3 + x(-1)C4$$

$$y(2) = x(4)C0 + x(3)C1 + x(2)C2 + x(1)C3 + x(0)C4$$

$Y(3)=x(5)C0+x(4)C1+x(3)C2+x(2)C3+x(1)C4$ $y(4)=x(6)C0+x(5)C1+x(4)C2+x(3)C3+x(2)C4$ $e(0)=x(0)-y(0)$ $e(1)=x(1)-y(1)$ $e(2)=x(2)-y(2)$ $e(3)=x(3)-y(3)$ $e(4)=x(4)-y(4)$ $e(5)=x(5)-y(5)$ $e(6)=x(6)-y(6)$ etc.

$C0(0)=e(0)\times(2),$ $C1(0)=e(0)\times(1),$ $C2(0)=e(0)\times(0),$ $C3(0)=e(0)\times(-1),$ $C4(0)=e(0)\times(-2)$ $C0(1)=e(0)\times(2)+e(1)\times(3),$ $C1(1)=e(0)\times(1)+e(1)\times(2),$ $C2(1)=e(0)\times(0)+e(1)\times(1),$ $C3(1)=e(0)\times(-1)+e(1)\times(0),$ $C4(1)=e(0)\times(-2)+e(1)\times(-1)$ $C0(2)=e(0)\times(2)+e(1)\times(3)+e(2)\times(4),$ $C1(2)=e(0)\times(1)+e(1)\times(2)+e(2)\times(3),$ $C2(2)=e(0)\times(0)+e(1)\times(1)+e(2)\times(2),$ $C3(2)=e(0)\times(-1)+e(1)\times(0)+e(2)\times(1),$ $C4(2)=e(0)\times(-2)+e(1)\times(-1)+e(2)\times(0)$ $C0(3)=e(0)\times(2)+e(1)\times(3)+e(2)\times(4)+e(3)\times(5),$ $C1(3)=e(0)\times(1)+e(1)\times(2)+e(2)\times(3)+e(3)\times(4),$ $C2(3)=e(0)\times(0)+e(1)\times(1)+e(2)\times(2)+e(3)\times(3),$ $C3(3)=e(0)\times(-1)+e(1)\times(0)+e(2)\times(1)+e(3)\times(2),$ $C4(3)=e(0)\times(-2)+e(1)\times(-1)+e(2)\times(0)+e(3)\times(1)$ $C0(4)=e(0)\times(2)+e(1)\times(3)+e(2)\times(4)+e(3)\times(5)+e(4)\times(6),$ $C1(4)=e(0)\times(1)+e(1)\times(2)+e(2)\times(3)+e(3)\times(4)+e(4)\times(5),$ $C2(4)=e(0)\times(0)+e(1)\times(1)+e(2)\times(2)+e(3)\times(3)+e(4)\times(4),$ $C3(4)=e(0)\times(-1)+e(1)\times(0)+e(2)\times(1)+e(3)\times(2)+e(4)\times(3),$ $C4(4)=e(0)\times(-2)+e(1)\times(-1)+e(2)\times(0)+e(3)\times(1)+e(4)\times(2)$ $C0(5)=e(0)\times(2)+e(1)\times(3)+e(2)\times(4)+e(3)\times(5)+e(4)\times(6)+e(5)\times(7),$ $C1(5)=e(0)\times(1)+e(1)\times(2)+e(2)\times(3)+e(3)\times(4)+e(4)\times(5)+e(5)\times(6),$ $C2(5)=e(0)\times(0)+e(1)\times(1)+e(2)\times(2)+e(3)\times(3)+e(4)\times(4)+e(5)\times(5),$ $C3(5)=e(0)\times(-1)+e(1)\times(0)+e(2)\times(1)+e(3)\times(2)+e(4)\times(3)+e(5)\times(4),$ $C4(5)=e(0)\times(-2)+e(1)\times(-1)+e(2)\times(0)+e(3)\times(1)+e(4)\times(2)+e(5)\times(3)$ $C0(6)=e(0)\times(2)+e(1)\times(3)+e(2)\times(4)+e(3)\times(5)+e(4)\times(6)+e(5)\times(7)+e(6)\times(8),$ $C1(6)=e(0)\times(1)+e(1)\times(2)+e(2)\times(3)+e(3)\times(4)+e(4)\times(5)+e(5)\times(6)+e(6)\times(7),$ $C2(6)=e(0)\times(0)+e(1)\times(1)+e(2)\times(2)+e(3)\times(3)+e(4)\times(4)+e(5)\times(5)+e(6)\times(6),$ $C3(6)=e(0)\times(-1)+e(1)\times(0)+e(2)\times(1)+e(3)\times(2)+e(4)\times(3)+e(5)\times(4)+e(6)\times(5),$ $C4(6)=e(0)\times(-2)+e(1)\times(-1)+e(2)\times(0)+e(3)\times(1)+e(4)\times(2)+e(5)\times(3)+e(6)\times(4)$ etc.

Accordingly, these equations can be represented as:

$$y(k) = \sum_{i=0}^{N} x(k - i + \text{delay}) \, Ci \qquad (1)$$

$$e(k) = \mu[x(k) - y(k)] \text{ and} \qquad (2)$$

$$Ci(k + 1) = Ci(k) + e(k) \, x(k - i + \text{delay}) \qquad (3)$$

where the order of the filter is N+1 and the delay factor is used to center the filter taps as described above, e.g., for FIG. 1 the delay is equal to 2. Those coefficients C which are unindexed in FIG. 1 are the periodically updated versions of the coefficients. Equations (1), (2) and (3) above are the familiar least means squares state equations for a standard transversal implementation.

Figure 2:
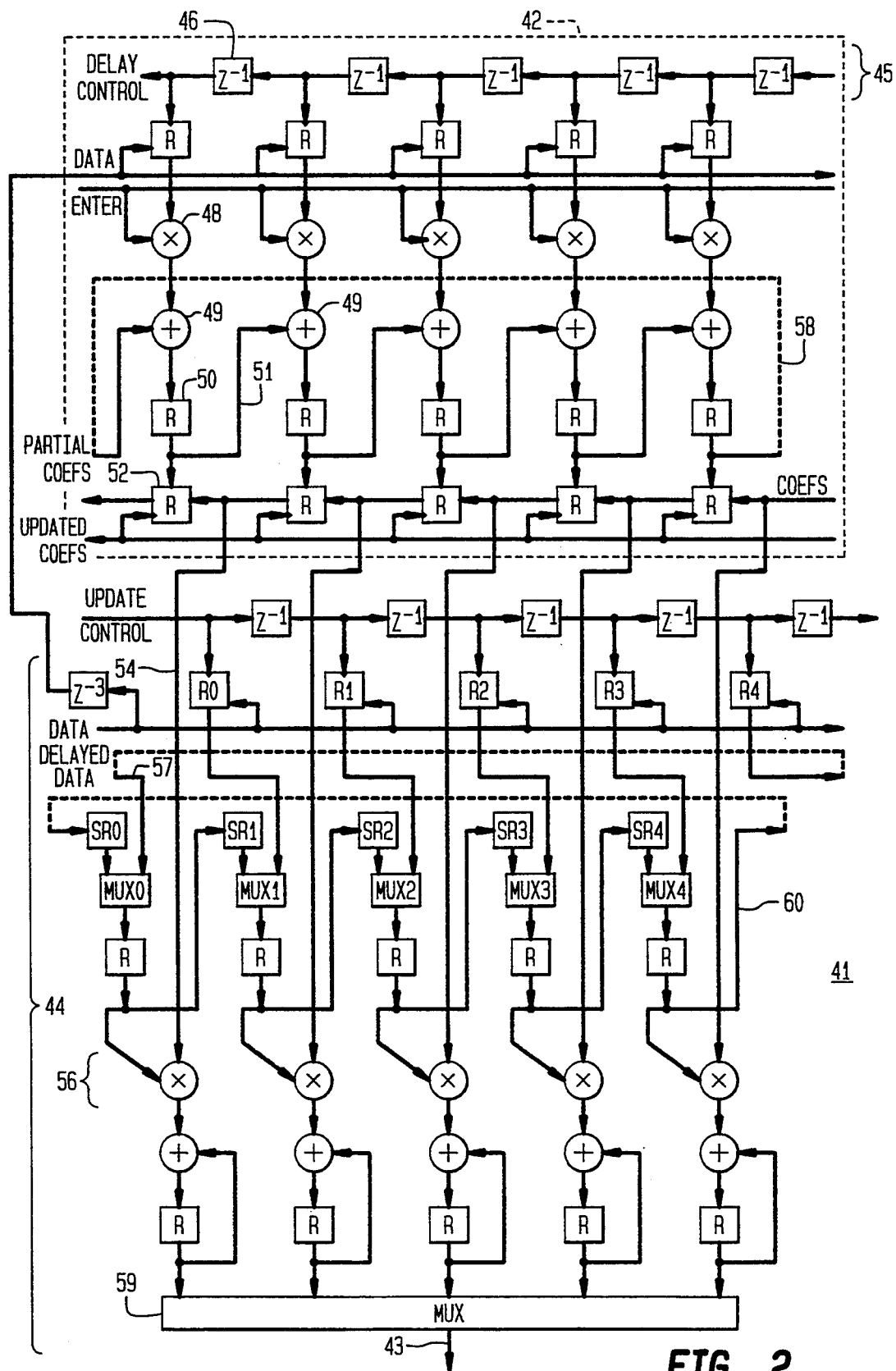
FIG. 2 is a top level conceptual block diagram of a fully systolic adaptive filter architecture according to the present invention.

Referring to FIG. 2, there is shown a top level conceptual block diagram of a fully systolic noncanonical least mean squares adaptive filter architecture according to the present invention. The systolic architecture 41 includes a systolic tap weight update section 42 enclosed in dashed lines followed by a systolic FIR filter section 44. The FIR filter section output 43 must first be computed for a given state vector, x(k−2), x(k−1), ... x(k+2) before the coefficient update process in section 42 can begin for that same state vector.

The coefficient or tap weight update section 42 includes a delay line 45 composed of a series of delays 46 activated via delay control timing pulses. A series of registers 47 store the input data in accordance with the timing pulses from the delay line 45. The registers 47 provide outputs to partial coefficient multipliers 48 which further receive the error signal as their other input. The output from the partial coefficient multipliers 48 is provided to an adder block 49. The adder block 49 receives as its other input a partial coefficient value from the last tap of the tap weight update section 42 via line 58. The sum signal from the adder block 49 is provided to a further register 50. This register 50 now contains the updated partial coefficient value for this particular tap. The updated coefficient value is transferred to both another register 52 as well as to the adder block 49 in the next tap of the tap weight update section 42 via line 51. The outputs from the second registers 52 are provided as updated inputs to the coefficient multipliers 56 in the FIR section 44 via line 54.

The data samples are transferred to the holding registers 47 from line 55 in accordance with the timing pulses from the delay line 45 once per frame. A frame of data is equivalent to one cycle through all of the data, for example, for ten coefficients, one frame is equal to ten data samples in length before the next delay control timing pulse is received. From the holding register 47, the new coefficient values are computed and stored in the coefficient delay register 50. A new error value enters the coefficient multiplier 48 with each data value, i.e., one error value per data clock cycle. The coefficient computation progresses in a left-to-right manner through the taps of the coefficient update section 42 at the data rate. In this manner, the updated coefficients are moving to the right at the same rate and position as the coefficient computation occurs. Therefore, new coefficient values can be transferred from the coefficient update section 42 to the FIR filter section 44 at any time the user requires. The FIR filter section 44 is of a standard systolic filter implementation in which each vertical section tap computes an output data sample and the outputs are sampled in sequence. As shown in FIG. 2, both the partial coefficient computations and the filter coefficients leaving their respective sections on the right side of the figure are fed back to the left-hand side at the ends of the filter via lines 58 and 60, respectively.

In order to derive the state equations for the systolic architecture of FIG. 2 as was done for the known transversal architecture of FIG. 1, the coefficient update section 42 is first analyzed. Assuming that the state vector from left-to-right is $x(-2), x(-1),...x(2)$ and that the error value $e(0)$ has been calculated from the output $y(0)$, then the coefficient update adder 49 on the far left of the figure accumulates $x(-2)e(0)$. The next adder 49 to the right accumulates $x(-1)e(0)$ with the following next adder to the right having $x(0)e(0)$, etc.

On the next clock cycle $x(3)$ is clocked into the left most holding register 47 (R) and the left most adder 49 accumulates $x(2)e(0)+x(3)e(1)$ and the next adder to the right accumulates $x(-2)e(0)+x(-1)e(1)$ and so on. After the sixth clock cycle the left most accumulator register 50 holds:

$$e(0)\times(-2)+e(1)\times(-1)+e(2)\times(0)+e(3)\times(1)+e(4)\times(2)+e(5)\times(3)=C4(5),$$

followed by
$$e(0)\times(-1)+e(1)\times(0)+e(2)\times(1)+e(3)\times(2)+e(4)\times(3)+e(5)\times(4)=C3(5),$$

and $e(0)\times(0)+e(1)\times 1)+e(2)\times(2)+e(3)\times(3)+e(4)\times(4)+e(5)\times(5)=C2(5),$ $$E(0)\times(1)+e(1)\times(2)+e(2)\times(3)+e(3)\times(4)+e(4)\times(5)+e(5)\times(6)=C1(5),$$

$$e(0)\times(2)+e(1)\times(3)+e(2)\times(4)+e(3)\times(5)+e(4)\times(6)+e(5(\times(7)=C0(5).$$

Looking in detail at the first eight clock cycles we have:

$C0(0)=e(0)\times(2),$ $C1(0)=e(0)\times(1),$ $C2(0)=e(0)\times(0),$ $C3(0)=e(0)\times(-1),$ $C4(0)=e(0)\times(-2)$ $C0(1)=e(0)\times(2)+e(1)\times(3),$ $C1(1)=e(0)\times(1)+e(1)\times(2),$ $C2(1)=e(0)\times(0)+e(1)\times(1),$ $C3(1)=e(0)\times(-1)+e(1)\times(0),$ $C4(1)=e(0)\times(-2)+e(1)\times(-1)$ $C0(2)=e(0)\times(2)+e(1)\times(3)+e(2)\times(4),$ $C1(2)=e(0)\times(1)+e(1)\times(2)+e(2)\times(3),$ $C2(2)=e(0)\times(0)+e(1)\times(1)+e(2)\times(2),$ $C3(2)=e(0)\times(-1)+e(1)\times(0)+e(2)\times(1),$ $C4(2)=e(0)\times(-2)+e(1)\times(-1)+e(2)\times(0)$ $C0(3)=e(0)\times(2)+e(1)\times(3)+e(2)\times(4)+e(3)\times(5),$ $C1(3)=e(0)\times(1)+e(1)\times(2)+e(2)\times(3)+e(3)\times(4),$ $C2(3)=e(0)\times(0)+e(1)\times(1)+e(2)\times(2)+e(3)\times(3),$ $C3(3)=e(0)\times(-1)+e(1)\times(0)+e(2)\times(1)+e(3)\times(2),$ $C4(3)=e(0)\times(-2)+e(1)\times(-1)+e(2)\times(0)+e(3)\times(1)$ $C0(4)=e(0)\times(2)+e(1)\times(3)+e(2)\times)4)+e(3)\times(5)+e(4)\times(6),$ $C1(4)=e(0)\times(1)+e(1)\times(2)+e(2)\times(3)+e(3)\times(4)+e(4)\times(5),$ $C2(4)=e(0)\times(0)+e(1)\times(1)+e(2)\times(2)+e(3)\times(3)+e(4)\times(4),$ $C3(4)=e(0)\times(-1)+e)1)\times(0)+e(2)\times(1)+e(3)\times(2)+e(4)\times(3),$ $C4(4)=e(0\times(-2)+e(1)\times(-1)+e(2)\times(10)+e(3)\times(1)+e(4)\times(2)$ $C0(5)=e(0)\times(2)+e(1)\times(3)+e(2)\times(4)+e(3)\times(5)+e(4)\times(6)+e(5)\times(7),$ $C1(5)=e(0)\times(1)+e(1)\times(2)+e(2)\times(3)+e(3)\times(4)+e(4)\times(5)+e(5)\times(6),$ $C2(5)=e(0)\times(0)+e(1)\times(1)+e(2)\times(2)+e(3)\times(3)+e(4)\times(4)+e(5)\times(5),$ $C3(5)=e(0\times(-1)+e(1)\times(0)+e(2)\times(1)+e(3)\times(2)+e(4)\times(3)+e(5)\times(4),$ $C4(5)=e(0)\times(-2)+e(1)\times(-1)+e(2)\times(0)+e(2)\times(0)+e(3)\times(1)+e(4)\times(2)+e(5)\times(3)$ $C0(6)=e(0)\times(2)+e(1)\times(3)+e(2)\times(4)+e(3)\times(5)+e(4)\times(6)+e(5)\times(7)+e(6)\times(8),$ $C1(6)=e(0)\times(1)+e(1)\times(2)+e(2)\times(3)+e(3)\times(4)+e(4)\times(5)+e(5)\times(6)+e(6)\times(7),$ $C2(6)=e(0)\times(0)+e(1)\times(1)+e(2)\times(2)+e(3)\times(3)+e(4)\times(4)+e(5)\times(5)+e(6)\times(6),$ $$C3(6) = e(0) \times (-1) + e(1) \times (0) + e(2) \times (1) + e(3) \times (2) + e(4) \times (3) + e(5) \times (4) + e(6) \times (5),$$

$$C4(6) = e(0) \times (-2) + e(1) \times (-1) + e(2) \times (0) + e(3) \times (1) + e(4) \times (2) + e(5) \times (3) + e(6) \times (4)$$

etc.

and the process continues indefinitely.

For the systolic FIR section 44, the description of the operation begins when register R0 contains $x(k-2)$, R1 contains $x(k-1)$, R2 contains $x(k)$, R3 contains $x(k+1)$, and R4 contains $x(k+2)$.

At an arbitrary clock time, CK0, C0 is present at the output of the left most coefficient register 52 and x(2) is loaded into the multiplier 56 of the left most FIR cell from R4 via MUX0 along the delayed data line 57. As a result, y(0)=C0x(2). At the same time, x(1) is clocked into SR0, and x(3) is loaded into R0.

At CK1, the coefficients are circularly shifted one place to the right. x(2) is loaded into SR1 and x(3) is loaded into the second FIR cell via MUX1 and multiplied times C0 to yield y(1)=C0x(3). The output of SR0 is selected via MUX0 to be multiplied by C1 to give y(0)=C0x(2)+C1x(1) and x(0) is clocked into SR0. x(4) is clocked into R1.

At CK2, the coefficients are again circularly shifted one place to the right. x(3) is loaded into SR2 and x(4) is loaded into the third FIR cell via MUX2 and multiplied times C0 to yield y(2)=C0x(4). The output of SR1 is selected via MUX1 to be multiplied by C1 to give y(1)=C0x(3)+C1x(2) and x(1) is clocked into SR1. The output of SR0 is selected via MUX0 to be multiplied by C2 to give y(0)=C0x(2)+C1x(1)+C2x(0). x(−1) is clocked into SR0. x(5) is clocked into R2.

At CK3, the coefficients are again circularly shifted one place to the right. x(4) is loaded into SR3 and x(5) is loaded into the fourth FIR cell via MUX3 and multiplied times C0 to yield y(3)=C0x(5). The output of SR2 is selected via MUX2 to be multiplied by C1 to give y(2)=C0x(4)+C1x(3) and x(2) is clocked into SR2. The output of SR1 is selected via MUX1 to be multiplied by C2 to give y(1)=C0x(3)+C1x(2)+C2x(1) and x(0) is clocked into SR1. The output of SR0 is selected via MUX0 to be multiplied by C3 to give y(0)=C0x(2)+C1x(1)+C2x(0)+C3x(1). x(−2) is clocked into SR0. x(6) is clocked into R3.

At CK4, the coefficients are again circularly shifted one place to the right. x(5) is loaded into SR4 and x(6) is loaded into the fourth FIR cell via MUX4 and multiplied times C0 to yield y(4)=C0x(6). The output of SR3 is selected via MUX3 to be multiplied times C1 to give y(3)=C0x(5)+C1x(4) and x(3) is clocked into SR3. The output of SR2 is selected via MUX2 and multiplied times C2 to give y(2)=C0x(4)+C1x(3)+C2x(2) and x(1) is clocked into SR2. The output of SR1 is selected via MUX1 to be multiplied by C3 to give y(1)=C0x(3)+C1x)2)+C2x)1)+C3x(0) and x(−1) is clocked into SR1. The output of SR0 is selected via MUX0 to be multiplied by C4 to give y(0)=C0x(2)+C1x(x)+C3x(−1)+C4x(−2). x(7) is clocked into R4. y(0) is now complete and is read through the MUX 59 and the FIR cell 0 accumulator is cleared. e(0) can be calculated and because of the N+1 stage delay (N+1 is the LMS order) between the FIR section data 44 input and the tap weight update section 42, the state vector in the tap weight update section is now $x(k-2), \ldots x(k+2)$, consistent with the tap weight update state equations described above.

At CK5, the coefficients are circularly shifted one place to the right. x(6) is loaded into SR0 and x(7) is loaded into the first FIR cell via MUX0 and multiplied times C0 to yield y(5)=C0x(7). The output of SR4 is selected via MUX4 and multiplied times C1 to give y(4)=C0x(6)+C1x(5) and x(4) is clocked into SR4. The output of SR3 is selected via MUX3 and multiplied times C2 to give Y(3)=C0x(5)+C1x(4)+C2x(3) and x(2) is clocked into SR3. The output of SR2 is selected via MUX2 and multiplied by C3 to give y(2)=C0x(4)+C1x(3)+C2x(2)+C3x(1) and x(0) is clocked into SR2. The output of SR1 is selected via MUX1 to be multiplied times C4 to give y(1)=C0x(3)+C1x(2)+C2x(1)+C3x(0)+C4x(−1) and x(7) is clocked into SR1. x(8) is clocked into R0. y(1) is now complete and read through MUX 59 and the FIR cell 2 accumulator is cleared. e(1) can be calculated and the process continues indefinitely to yield:

$$Y(0) = x(2)C0 + x(1)C1 + x(0)C2 + x(-1)C3 + x(-1)C3 + x(-2)C4$$

$$y(1) = x(3)C0 + x(2)C1 + x(1)C2 + x(0)C3 + x(-1)C4$$

$$y(2) = x(4)C0 + x(3)C1 + x(2)C2 + x(1)C3 + x(0)C4$$

$$Y(3) = x(5)C0 + x(4)C1 + x(3)C2 + x(2)C3 + x(1)C4$$

$$y(4) = x(6)C0 + x(5)C1 + x(4)C2 + x(3)C3 + x(2)C4$$

$$y(5) = x(7)C0 + x(6)C1 + x(5)C2 + x(4)C3 + x(3)C4$$

$$y(6) = x(8)C0 + x(7)C1 + x(6)C2 + x(5)C3 + x(4)C4$$

etc.

If the systolic structure is used in the equalizer described above, we get the error equations:

$$e(0) = x(0) - y(0)$$

$$e(1) = x(1) - y(1)$$

$$e(2) = x(2) - y(2)$$

$$e(3) = x(3) - y(3)$$

$$e(4) = x(4) - y(4)$$

$$e(5) = x(5) - y(5)$$

$$e(6) = x(6) - y(6)$$

This is the LMS estimation error equation.

In the systolic implementation however, beginning the update process at time n, the output equations become $$y(0) = x(2)C0(n) + x(1)C1(n+1) + x(0)C2(n+2) + x(-1)C3(n+3) + x(-2)C4(n+4)$$

$$y(1) = x(3)C0(n+1) + x(2)C1(n+2) + x(1)C2(n+3) + x(0)C3(n+4) + x(-1)C4(n+5)$$

$$Y(2) = x(4)C0(n+2) + x(3)C1(n+3) + x(2)C2(n+4) + x(1)C3(n+5) + x(0)C4(n+6)$$

$$y(3) = x(5)C0(n+3) + x(4)C1(n+4) + x(3)C2(n+5) + x(2)C3(n+6) + x(1)C4(n+7)$$

$$y(4)=x(6)C0(n+4)+x(5)C1(n+5)+x(4)C2(n+6)+x(3)C3(n+7)+x(2)C4(n+8)$$

$$y(5)=x(7)C0(n+5)+x(6)C1(n+6)+x(5)C2(n+7)+x(4)C3(n+8)+x(3)C4(n+9)$$

$$y(6)=x(8)C0(n+6)+x(7)C1(n+7)+x(6)C2(n+8)+x(5)C3(n+9)+x(4)C4(n+10)$$

Or in vector notation $$e(n)=e(n)-C^{\sim T}(n)\times(n),$$

where $C^{\sim T}(n)=C0(n), C1(n+1), C2(n+2), \ldots CN-1)(n+N)$.

Simulations have shown similar convergence characteristics between the transversal and systolic noncanonical LMS implementations.

FIG. 2A is a table showing the state matrix for the FIR section 44 of the architecture. It is included as an aid in conceptualizing the data flow. The table entries are shown as data sample indices k, where a data sample is represented as x(k). The indices are consistent with those used to describe the operation of the conceptual architecture of FIG. 2. Each row in the table shown in FIG. 2A corresponds to a clock cycle. Assuming proper coefficient alignment, valid output computation starts on the fifteenth row of the table with y(0), followed by y(1) on the next clock and so on. Row 20, the last row in the table, would result in the output of y(5).

Figure 3B:
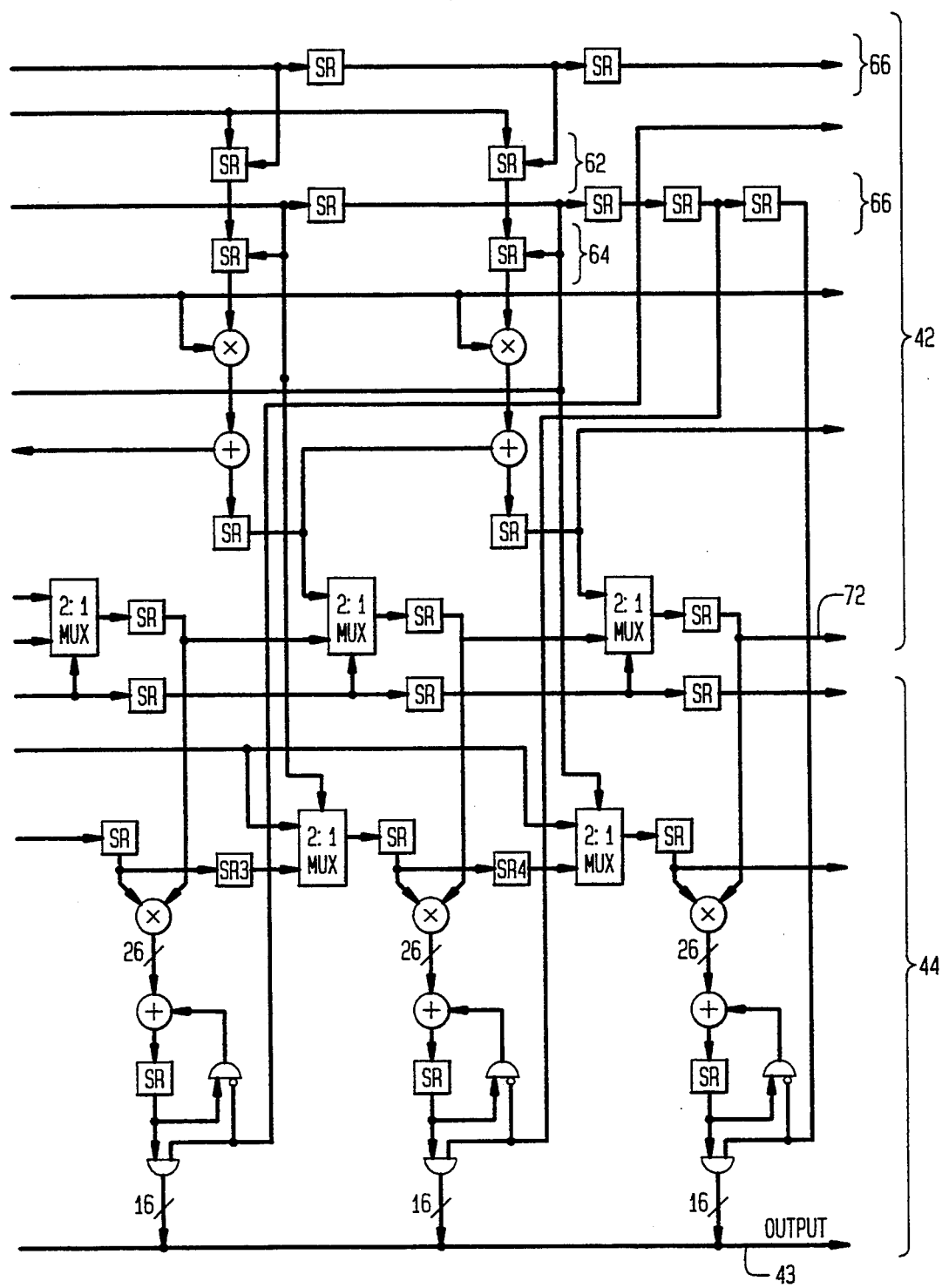
FIG. 3 is a block diagram for an actual implementation of the architecture in FIG. 2.

Referring to FIG. 3, there is shown the block diagram for an actual implementation of the fully systolic least mean squares adaptive filter as described above with respect to FIG. 2. The architecture 41 includes both a coefficient update section 42 and an FIR filter section 44. Each section 42 and 44 is fully systolic. The coefficient update section 42 includes a delay line indicated by bracket 45 comprised of shift registers 46 receiving a timing pulse from the delay control via a logic gate 61. A holding section indicated by bracket 62 includes a number of shift registers 47, one shift register 47 for each tap in the coefficient update section. These shift registers 47 receive input data sample inputs in parallel from the data sample line and a clocking signal from the delay line 45. The output from the shift registers 47 are provided to another line of registers 65 indicated by bracket 64 in accordance with a clocking signal from an array control. The array control signal is provided through a logic gate 63 to another delay line indicated by bracket 66 for alignment control of the shift register section 64 as well as the output section of the FIR filter 44. The outputs from the shift registers 65 are provided to multipliers 48, only two of which have reference numbers. As each section 42 and 44 is composed of several identically repetitive vertical taps, only one such tap will be further described. Multiplier 48 receives as its other input an error signal provided in parallel to the multipliers 48 through a logic gate 67. The output from multiplier 48 is provided to an adder 49 which receives as its other input a partial coefficient. The output from the adder 49 is then provided to a holding register 50. The output from the holding register 50 is then passed to the next tap section adder 49 as well as to the FIR section 44.

In operation of the coefficient update section 42, the top delay line 45 receives the timing pulses which shift across the taps one tap at a time. In this manner, the timing pulses operate to load the shift registers 47 in a sequential manner. For example, shift register 47 is loaded first in accordance with the timing pulse from the delay line 45, then the next shift register 47 in the next tap to the right is loaded via the timing pulse provided to it after having been delayed by the first shift register 46 in the delay line 45. In this manner, the shift registers 47 are sequentially loaded and the data samples are held for a frame of data. The data samples then pass through shift registers 65 to the multiplier 48 wherein the data sample is multiplied by the error signal. The output from the multiplier 48 is provided as an input to the adder 49 along with the partial coefficients to provide an updated partial coefficient value which is passed to the next tap to the right in the update section 42. In this manner, each coefficient is partially computed as it "walks" itself around the tap array. Partial coefficients are considered coefficients when they are transferred to the FIR section 44.

The updated values are further passed through a MUX 68 to a further storage register 70. This storage register 70 provides its output to the multipliers 56 in the FIR section 44 as well as to the MUX 68 in the next tap to the right of the coefficient update section 42. The MUXs 68 receive as their other input a previously updated coefficient from line 72. This previously updated coefficient is simply provided to allow for the updating of the coefficient used in FIR section 44 only once every n cycles. If updating every cycle is allowed, then MUX 68, register 70 and the update control can be eliminated and the output of register 50 can provide the input directly to multiplier 56. Similarly, the update control, delayed data, partial coefficients, array control and delay control signals shown on the left side of the figure would correspond with the signals on the right side of the figure when the architecture 41 is cascaded together to form a longer filter. The update control signal and update coefficients input are useful for providing additional features in the fully systolic architecture. However, they are not necessary to the implementation of the invention and can be eliminated with a resulting savings in components and size.

Because the coefficient update section 42 calculates the coefficients from left to right and yet the FIR filter section requires the coefficients to be processed from right to left, a sequential LIFO or forward loading shift register section 86 is constructed to position the filter's coefficients at the desired location in the filter's state vector. The forward loading shift register section 86 includes a delayed data sample input which is provided through a delay shift register (SR0-SR4) to a multiplexer 74. The multiplexer 74 further receives the current data sample as an input and is controlled via the array control signal. The output from the multiplexer 74 is then provided to a storage shift register cell 76 which provides the data sample to the multiplier 56 in the FIR filter 44. The other input to the multiplier 56 is the coefficient value stored in shift register 70 in the coefficient update section 42. The output from the multiplier 56 is provided to an adder 78. The output from the adder 78 is provided to a shift register 80 which is then output from the filter 43 through a logic gate 82 controlled via a signal 84 from the array control. An accumulator loop provides a feedback from shift register 80 to adder 78 in accordance with the array control signal. As noted above, the implementation of the multiplier/accumulator portion of FIR filter section 44 itself is of a conventional design.

The final output from FIR filter section 44 can be rounded to a word width of lesser precision prior to leaving the chip without introducing any error in addition to that introduced by rounding because the output was accumulated at full precision.

The forward loading shift register section 86 functions to append new data samples to the front end of the register and to read out the samples beginning with the last sample entered. In this manner, as the samples are added to the shift register section 86, the oldest samples are truncated as the section walks through the FIR filter 44.

The use of the logic gates shown on the left side of FIG. 3 operate to maintain the present coefficient value in the coefficient update section 42 when desirable.

It is readily apparent to those skilled in the art that while the actual implementation of FIG. 3 has been described with respect to the first tap in the coefficient update section 42 and the first filter tap in the FIR filter section 44, the remainder of the architecture merely replicates itself in accordance with the teachings of the invention. Further, while the actual implementation is shown for real data, it is understood that the present invention will operate for complex data or where there are multiple samples per symbol.

Figure 4:
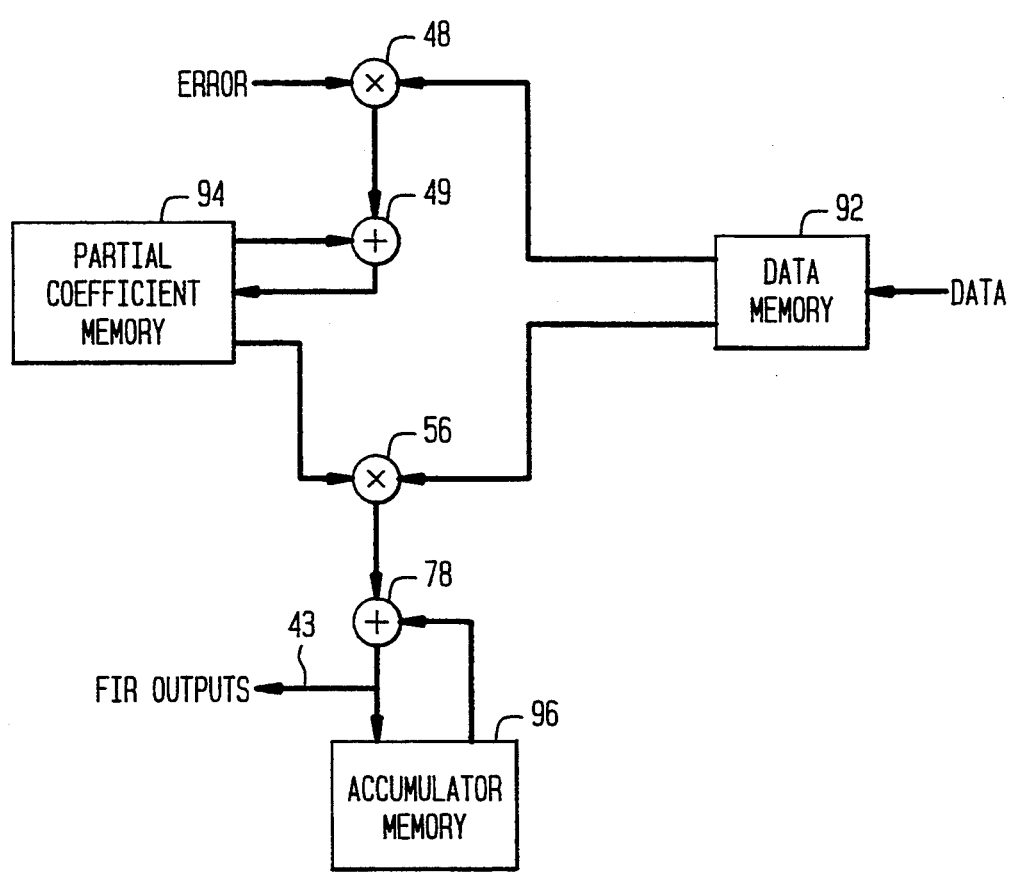
FIG. 4 is a block diagram of an embodiment of the present invention.

In a preferred embodiment of the invention, the updated coefficient values are stored in a large memory which allows the architecture 41 to operate at its computation rate by iterating the updated values in accordance with new data samples so long as the computation rate exceeds that of the data. This is particularly advantageous with respect to telephone communication links, phased array antennas, etc. FIG. 4 is a block diagram illustrating the memory necessary to compute multiple taps for a noncanonical LMS adaptive filter from a single tap. FIG. 4 shows a single computational tap including multiplier 48 receiving the error signal and the data as inputs. The data is output from a data memory 92 which receives input data at a certain data rate. A partial coefficient memory 94 provides partial coefficients to the adder 49 in the tap. The adder 49 receives its other input from multiplier 48 and provides an updated partial coefficient output to the partial coefficient memory 94.

Both the data memory 92 and partial coefficient memory 94 provide outputs to an FIR multiplier 56. The output from FIR multiplier 56 is provided to an adder 78. The adder 78 operates in conjunction with an accumulation memory 96 to accumulate the partial outputs before providing the FIR output over line 43. Thus, the single computing tap can practically form a long filter in accordance with the amount of memory. This operation is particularly advantageous wherein there is a low data rate input to the filter tap and a high computation rate within the filter tap itself. By doing this, the filter tap can iterate the data through its computations a multiple number of times so as to expand the filter length. For example, telephone communication links such as a T1 link operate at approximately 1.5 MHz whereas the computation rate of a filter section may be as high as 45 MHz. If sufficient memory is provided, then the single computing element can function as a filter having a length 30 times as great as itself.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A systolic adaptive digital filter, comprising:
   a first delay line formed of a plurality of delay units directly in series, each delay unit having an input and an output, the input of a first delay unit of the first delay line serving as a first timing input of the filter;
   a plurality of loading registers, each loading register having a first input, a clock input and an output, the first input of each loading register coupled in parallel serving as a data input of the filter and the clock input of each loading register being coupled to the first delay line with each clock input separated by one of the delay units;
   a plurality of multipliers, each multiplier having first and second inputs and an output, the first input of each multiplier being coupled to an output of a separate one of the loading registers and the second input of each multiplier coupled in parallel to an error input of the filter;
   a plurality of adders, such adder having first and second inputs and an output, the first input of each adder being coupled to an output of a separate one of the multipliers;
   a plurality of holding registers, each holding register having an input and an output, the input of each of the holding registers being coupled to an output of a separate one of the adders and the output of each holding register being fed to the second input of a separate next one of the adders in a chain-like manner;
   a plurality of first multiplexers, each first multiplexer having first and second inputs, a select input and an output, the first input of each first multiplexer being coupled to the output of a separate one of the holding registers;
   a plurality of storage registers, each storage register having an input and an output, the input of each storage multiplexers and the outputs of each storage register being coupled to a next one of said first multiplexers in a chain-like manner;
   a finite impulse response section providing a filter output including a plurality of second multipliers, each second multiplier having first and second inputs and an output, the first input of each of the second multipliers being coupled to the output of a separate one of the storage registers;
   a forward loading shift register circuit having a plurality of outputs with each one of the outputs being coupled to the second input of a separate one of the second multipliers, the forward loading shift register circuit first loading current data samples into the forward loading shift register circuit followed by previous data samples in a sequential last-in-first-out manner.

2. A digital filter according to claim 1, wherein said forward loading shift register circuit comprises:
   a plurality of delayed data registers, each delayed data register having an input and an output, the input of a first delayed data register serving as a delayed data input of the filter;
   a plurality of second multiplexers, each second multiplexer having first and second inputs, a select input and an output, the first input of each of the second multiplexers being coupled to the output of a separate one of the delayed data registers and the second input of each of the second multiplexers being coupled in parallel to the data input;

a plurality of second storage registers, each second storage register having an input and an output, the input of each of the second storage registers being coupled to the output of a separate one of the second multiplexers and the output of each second storage register being coupled to the second input of a separate one of the second multipliers and to the input of a separate one of the delayed data registers so as to arrange each pair of the second multiplexers and second storage registers between adjacent delayed data registers, the last of the delayed data registers having its output coupled to the second multiplier and to an output.

3. A digital filter according to claim 2, further comprising:

means for array control coupled to the plurality of second multiplexers and the finite impulse response section.

4. A digital filter according to claim 3, wherein the means for array control comprises:

a second delay line formed of a plurality of second delay units directly in series, each second delay unit having an input and an output, the output of one second delay unit of a pair of adjacent second delay units being coupled to the input of the other of the pair, the input of a first second delay unit in the second delay line serving as an array control input;

a plurality of alignment registers, each alignment register having an input, a trigger input and an output, the trigger input of each of the alignment registers being coupled between adjacent pairs of second delay registers in the second delay line, the input and output of each of the alignment registers coupling each of the alignment registers between separate pairs of the loading registers and first multipliers.

5. A digital filter according to claim 4, wherein the finite impulse response section further comprises:

a plurality of filter taps, each of the filter taps beginning with a separate one of the second multipliers and providing an accumulated tap output;

means for controlling accumulation in each of the filter taps connected to the array control means.

6. A digital filter according to claim 5, wherein each of the filter taps further comprises:

an adder having first and second inputs and an output, the first input being coupled to the output of the respective second multiplier;

a third storage register having an input and an output, the input of the third storage register being coupled to the output of the adder; and an accumulating loop coupling the output of the third storage register to the second input of the adder, the accumulator loop being controlled by the controlling accumulation means.

7. A digital filter according to claim 6, wherein the controlling accumulation means controls the accumulation loop via a logic gate coupled in line with the accumulation loop and an output gate which passes the output of the third storage register as the filter output.

8. A digital filter according to claim 7, further comprising:

an update control circuit including an updated coefficient input and a third delay line, the updated coefficient input coupling with the second input of a first of the first multiplexers, wherein the third delay line is formed of a plurality of third delay elements directly in series, each third delay element having an input and an output, the input of a first of the third delay elements serving as an update control input, wherein the select input of each of the first multiplexers are coupled between adjacent pairs of third delay elements.

9. A digital filter according to claim 8, further comprising:

a plurality of initial logic gates, a separate one of the initial logic gates coupling the first timing input, the array control input, the error input and the update control input to the first delay line, the second delay line, the second inputs of the multipliers and the third delay line, respectively.

10. A digital filter according to claim 7, wherein said filter output can be rounded to a word width of lesser precision without introducing any additional errors.

11. A digital filter according to claim 6 wherein said adder is cleared once the accumulator is read out.

12. A digital filter according to claim 5, further comprising:

an update control circuit including an updated coefficient input and a third delay line, said first multiplexers providing updated coefficient outputs as said outputs, wherein said updated coefficient outputs circulate from said output of the first multiplexer to the second input of the next first multiplexer and are wrapped around from the output of a last of said first multiplexers to the second input of a first of said first multiplexers, wherein the third delay line is formed of a plurality of third delay elements directly in series, each third delay element having an input and an output, the input of a first of the third delay elements serving as an update control input, wherein the select input of each of the first multiplexers are coupled between adjacent pairs of third delay elements.

13. A digital filter according to claim 12, further comprising:

a plurality of initial logic gates, a separate one of the initial logic gates coupling the first timing input, the array control input, the error input and the update control input to the first delay line, the second delay line, the second input of the multipliers and the third delay line, respectively.

14. A digital filter according to claim 12 wherein said update control means maintains current coefficient values without updating the coefficients.

15. A digital filter according to claim 1 wherein filter coefficient loading, filter coefficient shifting, filter coefficient calculating and data shifting occur in the same direction in the digital filter.

16. A wind range systolic adaptive digital filter, comprising:

a plurality of filter chips cascaded together, each filter chip having a set of inputs and a set of outputs, the set of outputs of one filter chip of a pair of adjacent filter chips being coupled to the set of inputs of the other of the pair with the first set of inputs of a first filter chip serving as a filter input, wherein each filter chip comprises:

a first delay line formed of a plurality of delay units directly in series, each delay unit having an input and an output, the input of a first delay unit of the first delay line serving as a first timing input of the filter;

a plurality of loading registers, each loading register having a first input, a clock input and an output, the first input of each loading register coupled in parallel serving as a data input of the filter and the clock input of each loading register being coupled to the first delay line with each clock input separated by one of the delay units;

a plurality of multipliers, each multiplier having first and second inputs and an output, the first input of each multiplier being coupled to an output of a separate one of the loading registers and the second input of each multiplier coupled in parallel to an error input of the filter;

a plurality of adders, such adder having first and second inputs and an output, the first input of each adder being coupled to an output of a separate one of the multipliers;

a plurality of holding registers, each holding register having an input and an output, the input of each of the holding registers being coupled to an output of a separate one of the adders and the outputs of each holding register being fed to the second input of a separate next one of the adders in a chain-like manner;

a plurality of first multiplexers, each first multiplexer having first and second inputs, a select input and an output, the first input of each first multiplexer being coupled to the output of a separate one of the holding registers;

a plurality of storage registers, each storage register having an input and an output, the input of each first multiplexer multiplexers and the output of each storage register being coupled to a next one of said first multiplexers in a chain-like manner;

a finite impulse response section providing a filter output including a plurality of second multipliers, each second multiplier having first and second inputs and an output, the first input of each of the second multipliers being coupled to the output of a separate one of the storage registers;

a forward loading shift-register circuit having a plurality of outputs with each one of the outputs being coupled to the second input of a separate one of the second multipliers, the forward loading shift register circuit first loading current data samples into the forward loading shift register circuit followed by old data samples in a sequential last-in-first-out manner;

wherein said forward loading shift register circuit comprises:
a plurality of delayed data registers, each delayed data register having an input and an output, the input of a first delayed data register serving as a delayed data input of the filter;
a plurality of second multiplexers, each second multiplexer having first and second inputs, a select input and an output, the first input of each of the second multiplexers being coupled to the output of a separate one of the delayed data registers and the second input of each of the second multiplexers being coupled in parallel to the data input;
a plurality of second storage registers, each second storage register having an input and an output, the input of each of the second storage registers being coupled to the output of a separate one of the second multiplexers and the output of each second storage register being coupled to the second input of a separate one of the second multipliers and to the input of a separate one of the delayed data registers so as to arrange each pair of the second multiplexers and second storage registers between adjacent delayed data registers, the last of the delayed data registers having its output coupled to the second multiplier and to an output;

means for array control coupled to the plurality of second multiplexers and the finite impulse response section.

17. A wide range digital filter according to claim 16, wherein the means for array control comprises:
a second delay line formed of a plurality of second delay units directly in series, each second delay unit having an input and an output, the output of one second delay unit of a pair of adjacent second delay units being coupled to the input of the other of the pair, the input of a first second delay unit in the second delay line serving as an array control input;
a plurality of alignment registers, each alignment register having an input, a trigger input and an output, the trigger input of each of the alignment registers being coupled between adjacent pairs of second delay registers in the second delay line, the input and output of each of the alignment registers coupling each of the alignment registers between separate pairs of the loading registers and first multipliers.

18. A wide range digital filter according to claim 17, wherein the finite impulse response section further comprises:
a plurality of filter taps, each of the filter taps beginning with a separate one of the second multipliers and providing an accumulated tap output;
means for controlling accumulation in each of the filter taps connected to the array control means.

19. A wide range digital filter according to claim 18, wherein each of the filter taps further comprises:
an adder having first and second inputs and an output, the first input being coupled to the output of the respective second multiplier;
a third storage register having an input and an output, the input of the third storage register being coupled to the output of the adder; and
an accumulating loop coupling the output of the third storage register to the second input of the adder, the accumulator loop being controlled by the controlling accumulation means.

20. A wide range digital filter according to claim 19, further comprising:
an update control circuit including an updated coefficient input and a third delay line, said first multiplexers providing updated coefficient outputs as said outputs, wherein said updated coefficient outputs circulate from said output of the first multiplexer to the second input of the next first multiplexer, said updated coefficient outputs being wrapped from the updated coefficient output of a last of said first multiplexers of a last of said filter chips to the second input of a first of said first multiplexers of the first of said filter chips;

wherein the third delay line is formed of a plurality of third delay elements directly in series, each third delay element having an input and an output, the input of a first of the third delay elements serving as an update control input;

wherein the select input of each of the first multiplexers is coupled between adjacent pairs of third delay elements.

21. A wide range digital filter according to claim 19, wherein each filter chip includes a filter output, said filter output being roundable to a word width of lesser precision without introducing any additional errors.

22. A forward loading shift register circuit comprising:

a plurality of delayed data registers, each delayed data register having an input and an output, the input of a first delayed data register serving as a delayed data input;

a plurality of multiplexers, each multiplexer having first and second inputs, a select input and an output, the first input of each of the multiplexers being coupled to the output of a separate one of the delayed data registers and the second input of each of the multiplexers being coupled in parallel to a data input;

a plurality of storage registers, each storage register having an input and an output, the input of each of the storage registers being coupled to the output of a separate one of the multiplexers and the output of each storage register being coupled to the input of a separate one of the delayed data registers so as to arrange each pair of the multiplexers and storage registers between adjacent delayed data registers, wherein current data samples are first loaded in the first of said multiplexers followed by previous data samples in a sequential last-in-first-out manner.

* * * * *

UNITED STATES PATENT AND TRADEMARK OFFICE
CERTIFICATE OF CORRECTION

PATENT NO. : 5,450,339
DATED : September 12, 1995
INVENTOR(S) : David B. Chester, et al It is certified that error appears in the above-identified patent and that said Letters Patent is hereby corrected as shown below:

On the title page, insert [73], Assignee: Harris Corporation, Melbourne, FL.

Signed and Sealed this

Seventeenth Day of February, 1998

Attest:

BRUCE LEHMAN

Attesting Officer      Commissioner of Patents and Trademarks